US005503173A

United States Patent [19]
Kudo et al.

[11] Patent Number: 5,503,173
[45] Date of Patent: Apr. 2, 1996

[54] WAFER CLEANING TANK

[75] Inventors: Hideo Kudo; Isao Uchiyama, both of Fukushima, Japan

[73] Assignee: Shin-Etsu Handotai Co., Ltd., Tokyo, Japan

[21] Appl. No.: 352,240

[22] Filed: Dec. 8, 1994

[30] Foreign Application Priority Data

Dec. 14, 1993 [JP] Japan .................................. 5-312948

[51] Int. Cl.$^6$ ................................................ B08B 11/02
[52] U.S. Cl. .......................... 134/201; 206/454; 206/711; 211/41; 269/43; 269/296; 269/903
[58] Field of Search .................... 134/902, 201; 118/500; 211/41; 269/903, 43, 296; 206/334, 454, 564

[56] References Cited

U.S. PATENT DOCUMENTS

| 4,191,295 | 3/1980 | Tams, III | 211/41 |
|---|---|---|---|
| 4,574,950 | 3/1986 | Koe et al. | 211/41 X |

FOREIGN PATENT DOCUMENTS

| 0385536 | 9/1990 | European Pat. Off. | 134/902 |
|---|---|---|---|
| 2626261 | 1/1988 | France . | |
| 59-134834 | 8/1984 | Japan . | |
| 116731 | 5/1991 | Japan | 134/902 |
| 231428 | 10/1991 | Japan | 134/902 |
| 266431 | 11/1991 | Japan | 134/902 |
| 49619 | 2/1992 | Japan | 134/902 |
| 332129 | 11/1992 | Japan | 134/902 |
| 5036664 | 2/1993 | Japan . | |

*Primary Examiner*—Philip R. Coe
*Attorney, Agent, or Firm*—Nikaido Marmelstein Murray & Oram

[57] ABSTRACT

A wafer cleaning tank including a tank body containing therein a cleaning solution, and wafer supporting device for substantially vertically supporting at least one wafer in the tank body, wherein the wafer supporting device includes a pair of confronting fixed wafer support members disposed in the tank body with a predetermined space therebetween and each having at least one side wafer-supporting portion, and a movable wafer support member vertically movably disposed centrally between the fixed wafer support members at a level below the fixed wafer support members and having at least one central wafer-supporting portion corresponding in position to the position of the side wafer-supporting portion of each of the fixed wafer support members, and wherein the side wafer-supporting portions and the central wafer-supporting portion jointly form a three-point support structure which supports the wafer at three points on the outer edge thereof. The wafer cleaning tank thus constructed is capable of cleaning a plurality of wafers at one time and well adaptable to the cleaning of wafers of different diameters.

3 Claims, 8 Drawing Sheets

5,503,173

WAFER CLEANING TANK

BACKGROUND OF THE INVENTION

1. Field of the Invention

The present invention relates to a wafer cleaning bath or tank in which one or more wafers of semiconductor single crystal (hereinafter referred to as "wafers") are substantially vertically immersed batch by batch in a cleaning solution to clean off or remove dirt and residual impurities left on the wafers.

2. Description of the Related Art

In the semiconductor device fabrication, residual impurities on the surface of a wafer affect the performance of fabricated semiconductor devices.

In view of this, the wafer shaping process includes a cleaning step in which wafers are cleaned by use of various cleaning methods. The wafer cleaning methods currently used are generally classified into a physical cleaning method and a chemical cleaning method.

The physical cleaning method includes: brush scrubbing in which a cleaning brush is used to directly remove residual impurities and foreign matters left on the wafer surface; high-pressure jet scrubbing in which a high-pressure fluid jet from a nozzle is directed to a portion of or the entire surface of a wafer to remove impurities; and ultrasonic cleaning in which wafers are immersed in a solution and are agitated by ultrasonic energy to remove residual impurities on the wafers.

On the other hand, the chemical cleaning method includes: chemical decomposition cleaning in which various chemicals and enzymes are used to chemically decompose impurities and foreign matters on the wafer surface. The physical cleaning method and the chemical cleaning method may be used in combination with each other.

In the semiconductor device fabrication art, the wafer diameter has been steadily increasing to cope with the tendency of semiconductor devices toward higher scale integration. Accordingly, a conventional cleaning method in which a plurality of wafers are received at one time in the same carrier cassette requires a great deal of labor.

Furthermore, if the wafers are transported while they are received in the carrier cassette, such transportation will encounter a problem that the wafers are contaminated with particles and the like adhering thereto due to contact between the wafers and the carrier cassette.

With the foregoing difficulties in view, the present inventors have proposed a cassette-less automatic wafer cleaning equipment in which wafers are substantially vertically supported one at a time and cleaned by immersing them one by one in a cleaning solution in each of successive cleaning baths or vessels (Japanese Patent Laid-open Publication No. 5-36667). Also proposed by the present inventors have been a wafer cleaning tank which is capable of immersing one wafer at a time in a cleaning solution while supporting the wafer stably in a substantially vertical position (Japanese Patent Laid-open Publication No. 5-36664).

The proposed cassette-less automatic wafer cleaning equipment has received favorable appreciation for its ability of providing a considerable reduction of labor as compared to the aforesaid conventional cleaning method in which a carrier cassette is used to receive a plurality of wafers, and solving the wafer-contamination problem caused by the carrier cassette.

However, the cassette-less automatic wafer cleaning equipment still has a problem that since the wafers are cleaned one by one or on the sheet-by-sheet basis, a further improvement in the productivity cannot be expected. In addition, for this cleaning equipment, it is extremely difficult to deal with the cleaning of wafers of different diameters because a high positioning accuracy required for setting and handling of the wafers renders the cleaning equipment complicated in construction.

Through investigations started with a view to improving the productivity of the cassette-less automatic wafer cleaning equipment, the present inventors have succeeded in devising a unique wafer supporting mechanism which is capable of supporting a plurality of wafers at one time in a cleaning tank, thereby improving the productivity of a cleaning equipment in an unrestricted manner, and which employs a three-point support structure enabling the cleaning of wafers of different diameters.

SUMMARY OF THE INVENTION

It is accordingly an object of the present invention to provide a wafer cleaning tank which is capable of cleaning a plurality of wafers at a time while supporting them stably in a substantially vertical position by means of a three-point supporting structure, thereby realizing a cassette-less automatic wafer cleaning equipment of high productivity and well adaptable to the cleaning of wafers of different diameters.

To attain the foregoing object, the present invention seeks to provide a wafer cleaning tank comprising a cleaning tank body containing therein a cleaning solution, and wafer supporting means for substantially vertically supporting at least one wafer in the cleaning tank body. The wafer supporting means includes a pair of confronting fixed wafer support members disposed in the cleaning tank body with a predetermined space therebetween and each having at least one side wafer-supporting portion for supporting an outer edge of the wafer, and a movable wafer support member vertically movably disposed centrally between the pair of fixed wafer support members at a level below the fixed wafer support members and having at least one central wafer-supporting portion corresponding in position to the position of said side wafer-supporting portion of each of said fixed wafer support members for supporting the outer edge of the wafer. The side wafer-supporting portions and the central wafer-supporting portion jointly form a three-point support structure which supports the wafer at three points on the outer edge thereof.

In a preferred form, the movable wafer supporting member has opposite ends each pivoted to one end of a pair of adjustment rods, the other end of each of the adjustment rods having a suspending portion hung on each of two confronting side plates of the wafer cleaning tank, the other end of the adjustment rods being movable toward and away from each other to move the movable wafer support member in a vertical direction.

Preferably, the fixed wafer support members and the movable wafer support member are parallel spaced from one another and each composed of an elongated round bar having a plurality of circumferential grooves formed at regular intervals along the length of the round bar. The circumferential grooves each forms the side wafer-supporting portion or the central wafer-supporting portion and is receptive of a portion of the outer edge of the wafer.

With the wafer cleaning tank of the foregoing construction, one or more wafers are immersed in a cleaning solution while they are supported stably in a substantially vertical position by means of the three-point support structure jointly formed by the side wafer-supporting portions and the central wafer-supporting portion. The thus immersed wafers are cleaned batch by batch. Since the movable wafer support member disposed between the fixed wafer support members is vertically movable to vary the space between the adjacent support members, so that wafers having different diameters can reliably be supported by the support members and, hence, they can readily be cleaned batch by batch in the wafer cleaning tank.

The above and other objects, features and advantages of the present invention will become manifest to those versed in the art upon making reference to the detailed description and the accompanying sheets of drawings in which a preferred structural embodiment incorporating the principle of the present invention is shown by way of illustrative example.

DETAILED DESCRIPTION OF THE INVENTION

Figure 1:
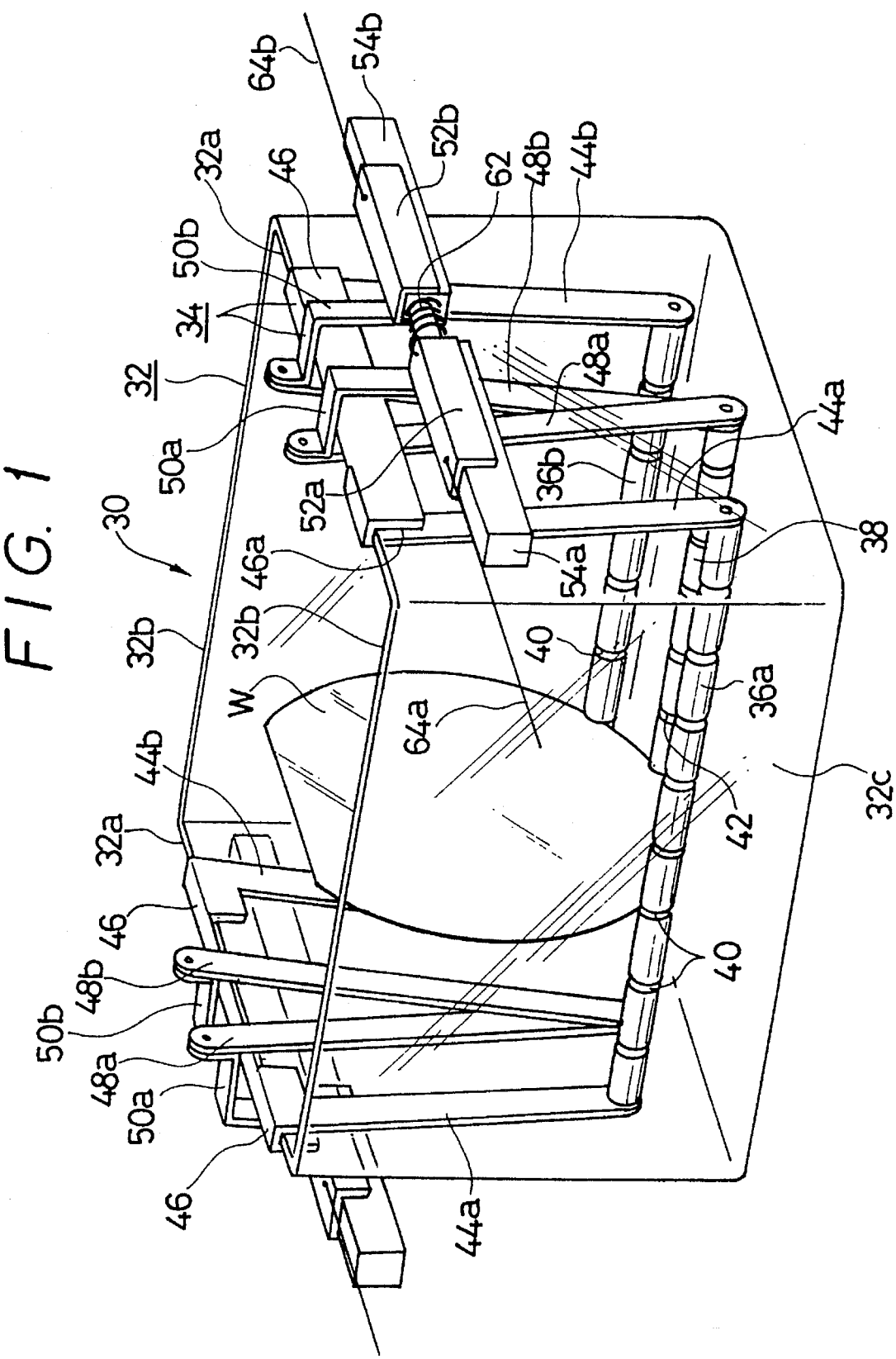
FIG. 1 is a schematic perspective view of a wafer cleaning tank according to an embodiment of the present invention.

Referring now to the drawings and FIG. 1 in particular, there is shown in perspective a wafer cleaning bath or tank 30 according to a preferred embodiment of the present invention.

As shown in FIG. 1, the wafer cleaning tank 30 includes a cleaning tank body 32 in the shape of a rectangular hollow box or container composed of two pairs of confronting side plates 32a, 32a and 32b, 32b and a bottom plate 32c. The tank 30 holds therein a cleaning solution.

Designated by 34 is a wafer supporting means or device for supporting one or more wafers W in a substantially vertical position in the cleaning tank body 32. The wafer supporting device 34 is composed of a pair of fixed wafer support members 36a, 36b disposed in the cleaning tank body 32, and a movable wafer support member 38 disposed centrally between the fixed wafer support members 36a, 36b at a position or level below the fixed wafer support members 36a, 36b. The movable wafer support member 38 is vertically movable in a manner described later. The fixed wafer support members 36a, 36b each has one or more side wafer-supporting portions 40, while the movable wafer support member 38 has one or more central wafer-supporting portion 42 which correspond in position to the position of the side wafer-supporting portions 40 of the respective fixed wafer support members 36a, 36b.

In the illustrated embodiment, the fixed wafer support members 36a, 36b and the movable wafer support member 38 are parallel spaced from one another and each composed of an elongated round bar having a plurality of circumferential grooves which are formed at regular intervals along the length of said round bar and each circumferential groove forms one of the side wafer-supporting portions 40 or the central wafer-supporting portions 42. The wafer-supporting portions 40, 42, i.e., the circumferential grooves in the round bar are each receptive of a portion of the outer edge of the wafer W.

Each of the fixed wafer support members 36a, 36b has opposite ends each connected to a lower end of a fixed rod 44a, 44b. The respective upper ends of the fixed rods 44a and 44b are joined with an elongated attachment plate 46. The attachment plate 46 has an engagement groove 46a. The engagement groove 46a is engaged with an upper edge of each of the side plates 32a, 32a so that the fixed wafer support members 36a, 36b are fixedly disposed in a predetermined position or level in the cleaning tank body 32.

On the other hand, the movable wafer support member 38 has opposite ends each pivoted to respective lower ends of a pair of adjustment rods 48a, 48b. The upper ends of the respective adjustment rods 48a, 48b are pivotally connected to hook-shaped suspending portions 50a, 50b. The suspending portions 50a, 50b are hung on the upper edge of each of the side plates 32a, 32a so that the movable wafer support member 38 is disposed in a predetermined position or level in the cleaning tank body 32.

Designated by 52a, 52b are slide members attached to the lower ends of the hook-shaped suspending portions 50a, 50b, respectively. The slide members 52a, 52b are slidably mounted on a pair of aligned elongated guide blocks 54a, 54b, respectively. The guide blocks 54a, 54b are fixedly mounted on a support table 58 (FIGS. 3 and 4) attached to a mount base or frame 56 (FIGS. 3 and 4) disposed adjacent to the cleaning tank body 32.

Figure 2:
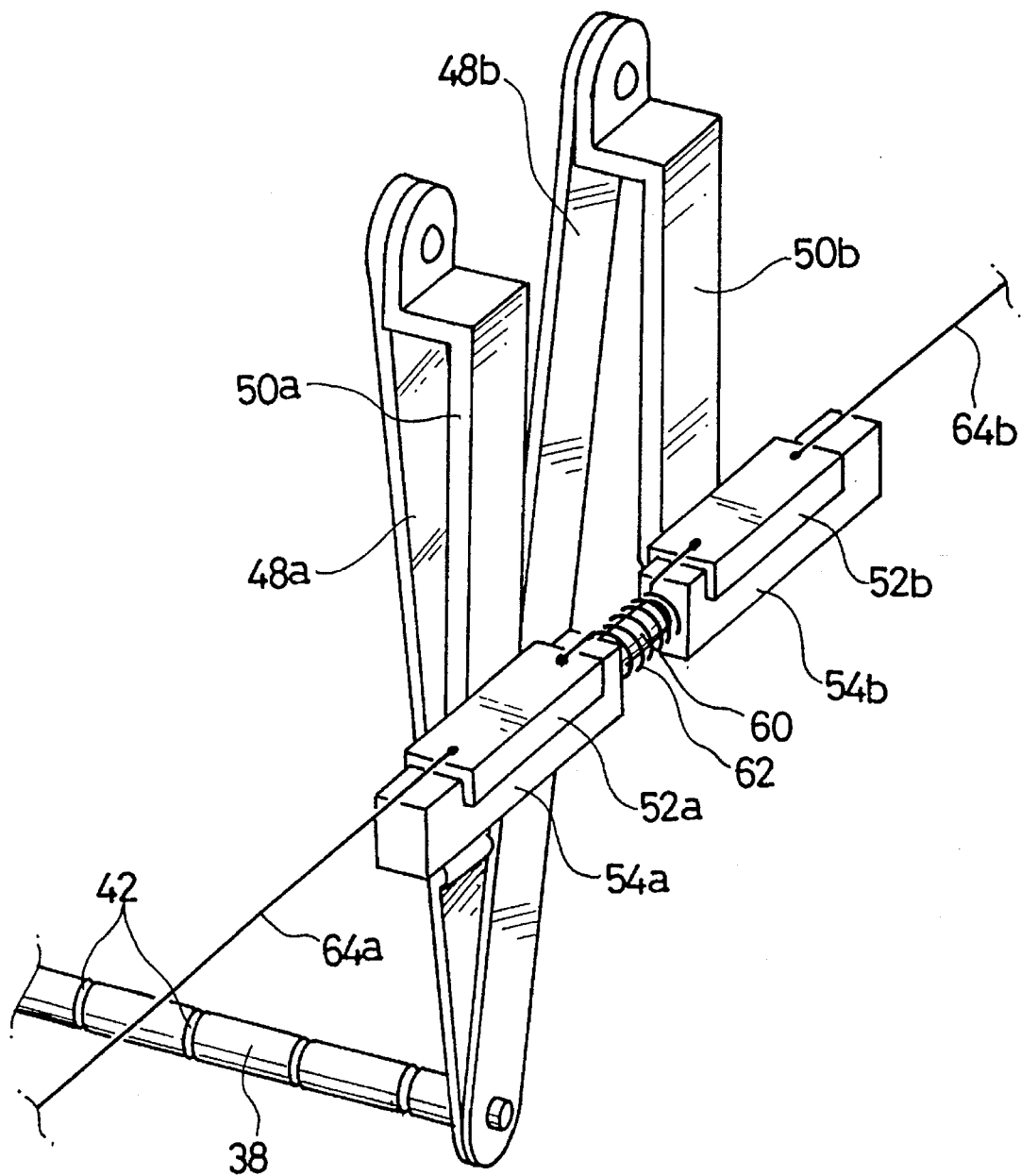
FIG. 2 is an enlarged perspective view showing a main portion of the wafer cleaning tank.

The guide blocks 54a and 54b are interconnected by a connecting rod 60 (FIG. 2), and a tension coil spring 62 is disposed around the connecting rod 60. The tension coil spring 62 has opposite ends connected to confronting inner ends of the slide members 52a, 52b. The outer ends of the respective slide members 52a, 52b are connected to one end of a pair of actuating wires 64a, 64b, respectively.

Figure 3:
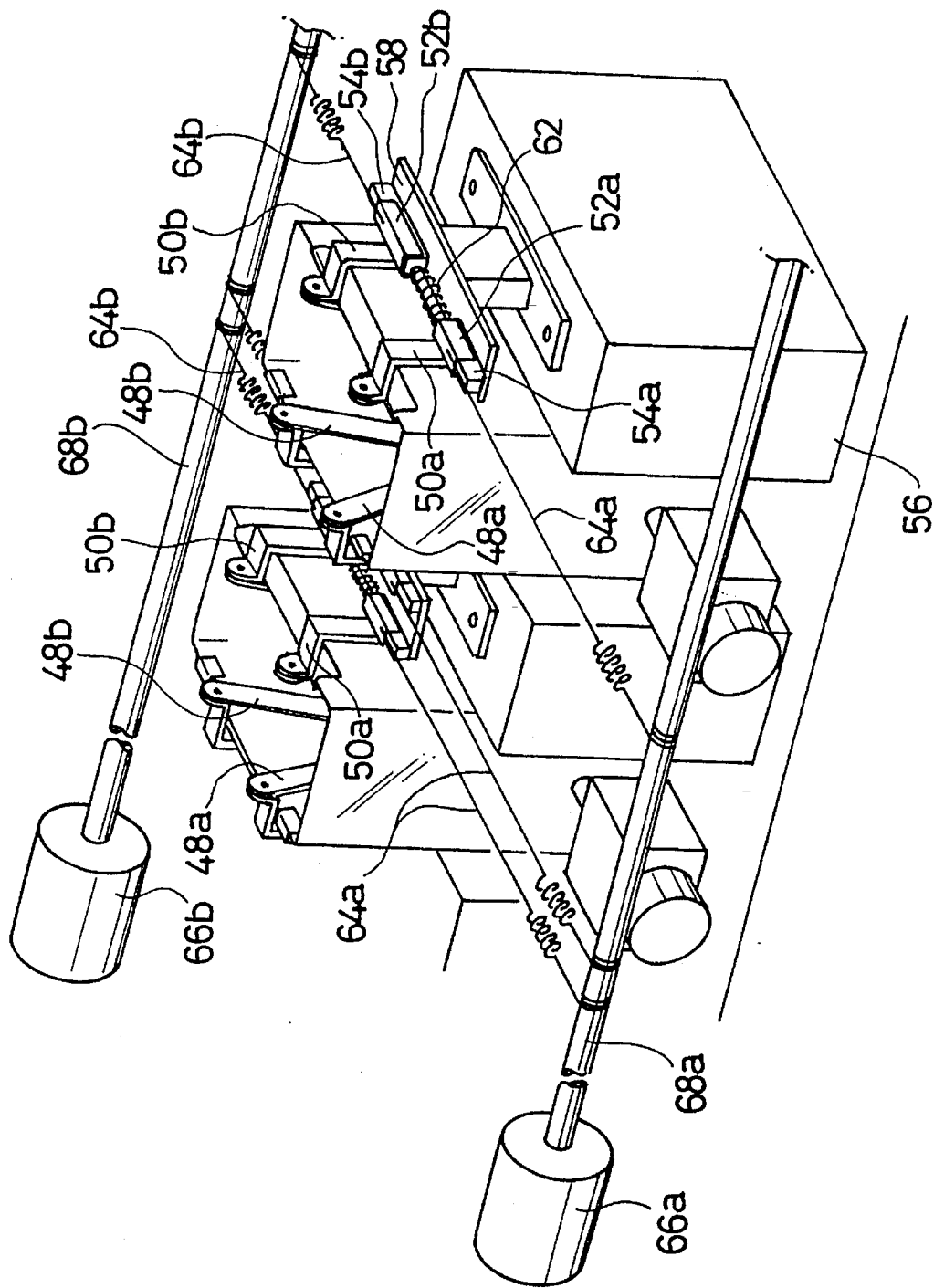
FIG. 3 is a diagrammatical perspective view illustrating a drive mechanism associated with a movable wafer support member of the wafer cleaning tank.
Figure 4:
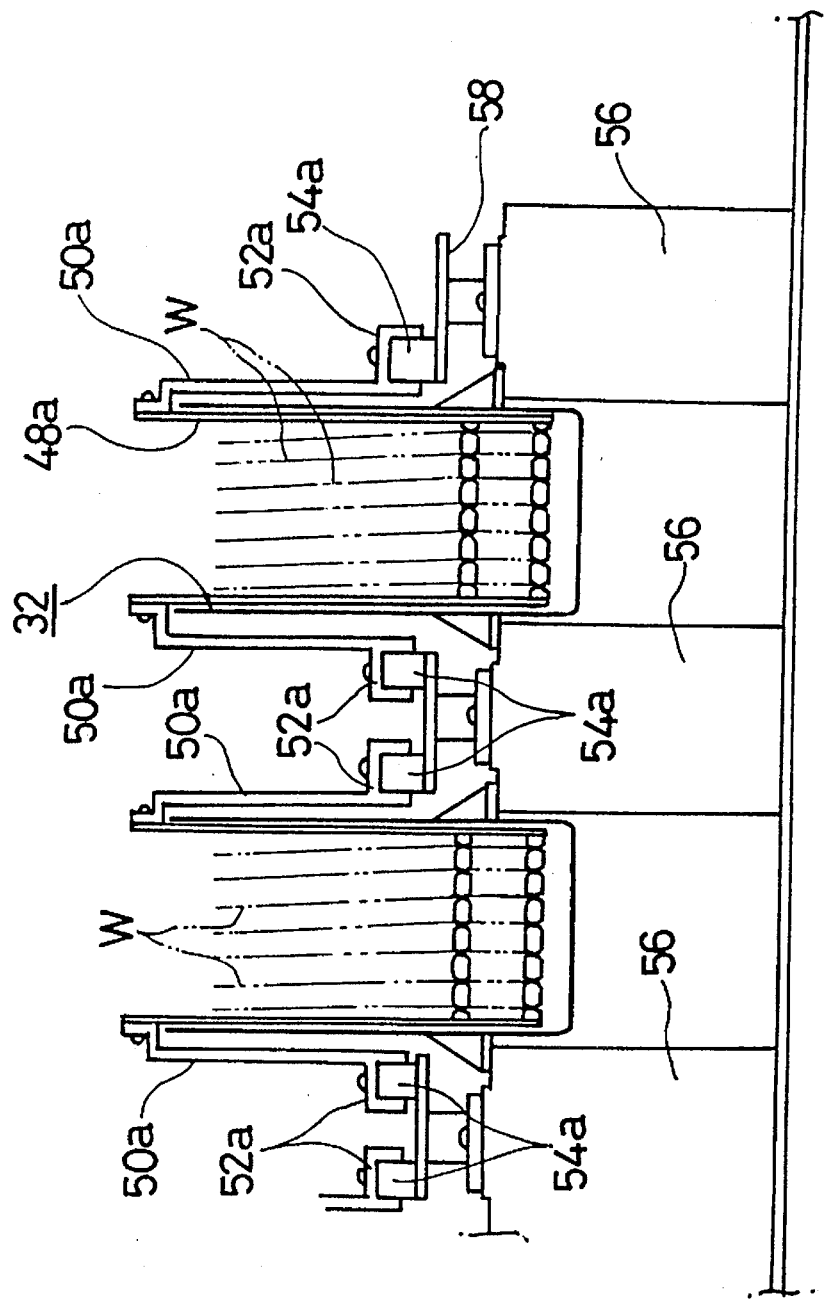
FIG. 4 is a diagrammatical front elevational view illustrative of the condition in which a plurality of wafers are supported in the wafer cleaning tank.

Designated by 66a and 66b in FIG. 3 are reversible motors disposed on opposite sides of the cleaning tank body 32. The motors 66a, 66b are coupled with a pair of rotating shafts 68a, 68b, respectively. The opposite end of each of the actuating wires 64a, 64b is fixedly connected to a corresponding one of the rotating shafts 68a, 68b.

With this construction, when the motors 66a, 66b are driven to rotate the associated rotating shafts 68a, 68b in a direction to wind up the actuating wires 64a, 64b, the slide members 52a, 52b are moved outwardly away from each other against the force of the tension coil spring 62, thereby spreading apart the upper ends of the adjustment rods 48a, 48b against the force of the tension coil spring 62. Concurrently with this spreading movement of the adjustment rods 48a, 48b, the movable wafer support member 38 is displaced upwardly. Conversely when the motors 66a, 66b are driven to rotate the associated rotating shafts 68a, 68b in a direction to unwind the actuating wires 64a, 64b, the slide members 52a, 52b are moved inwardly toward each other under the force of the tension coil spring 62, thereby contracting the upper ends of the adjustment rods 48a, 48b. Concurrently with this contracting movement of the adjustment rods 48a, 48b, the movable wafer support member 38 is displaced downwardly.

Figure 5:
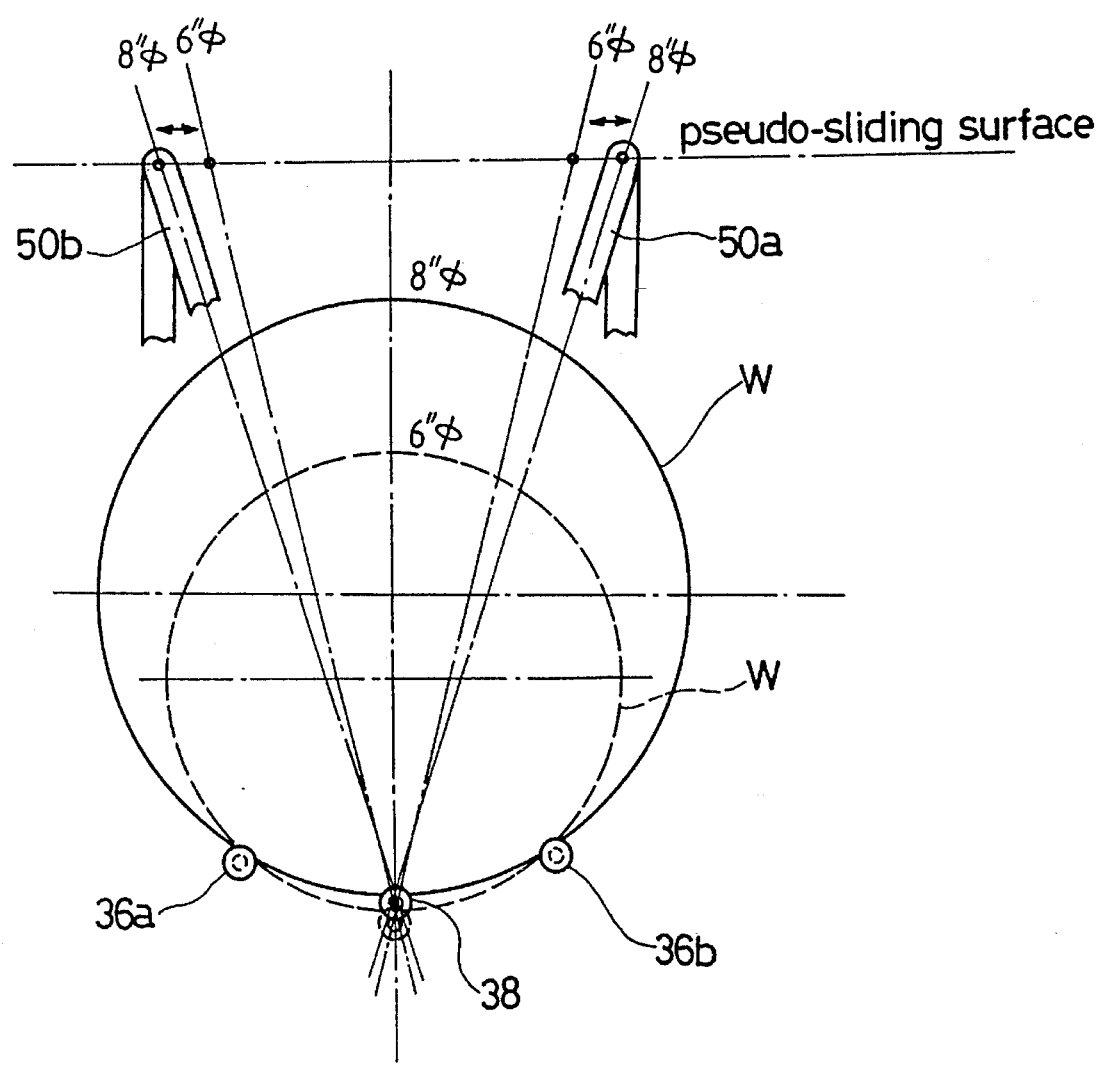
FIG. 5 is a diagrammatical view illustrative of the manner in which a three-point support structure provided in the wafer cleaning tank accommodates itself to a change in the wafer diameter.

As shown in FIG. 5, when a wafer W having a diameter of 8 inches is to be supported, the movable wafer support member 38 disposed centrally between the fixed wafer support members 36a, 36b and located at a level downwardly spaced a predetermined distance from the common level of the fixed wafer support members 36a, 36b, so that the three wafer support members 36a, 38 and 36b jointly form a three-point support structure which is able to support the 8-inch-diameter wafer W in an extremely stable condition.

When the arrangement set for supporting the 8-inch-diameter wafers W is to be changed to a setting for supporting 6-inch-diameter wafers W, as shown in FIG. 5, the movable wafer support member 38 should be moved downwards. To this end, the motors 66a, 66b shown in FIG. 3 are rotated in a direction by a predetermined number of turns or revolutions so as to contract the upper ends of the adjustment rods 48a, 48b.

Conversely when the arrangement set for supporting the 6-inch-diameter wafers W is to be changed to a setting for the 8-inch-diameter wafers W, the movable wafer support member 38 should be moved upwards. Accordingly, the motors 66a, 66b are rotated in the opposite direction by the predetermined number of revolutions to spread apart the upper ends of the adjustment rods 48a, 48b. It appears from the foregoing that the wafers W having different diameters can readily be cleaned in the wafer cleaning tank 30.

Figure 6:
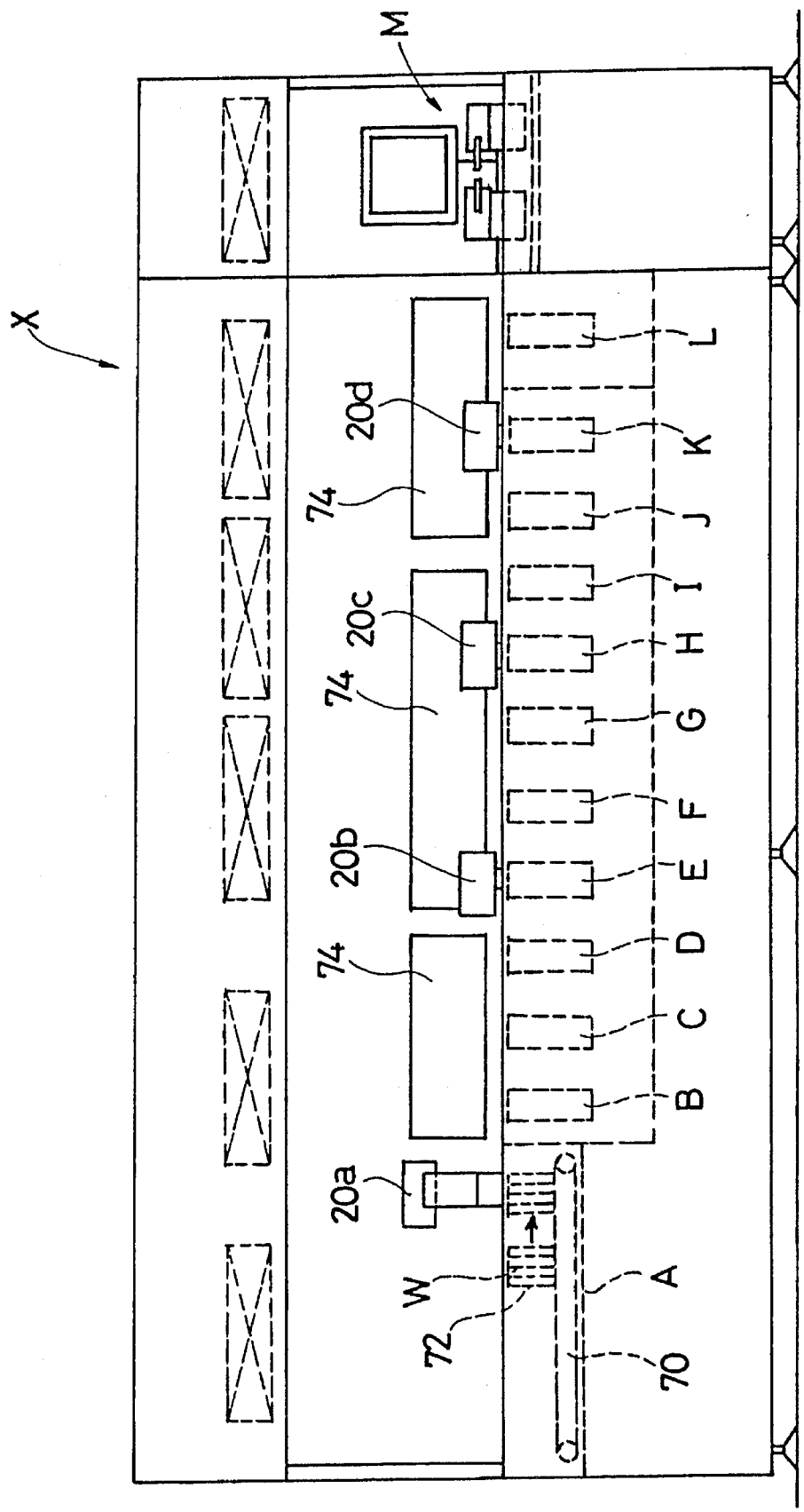
FIG. 6 is a schematic front elevational view of an automatic wafer cleaning equipment in which the wafer cleaning tank of the present invention is incorporated.
Figure 7:
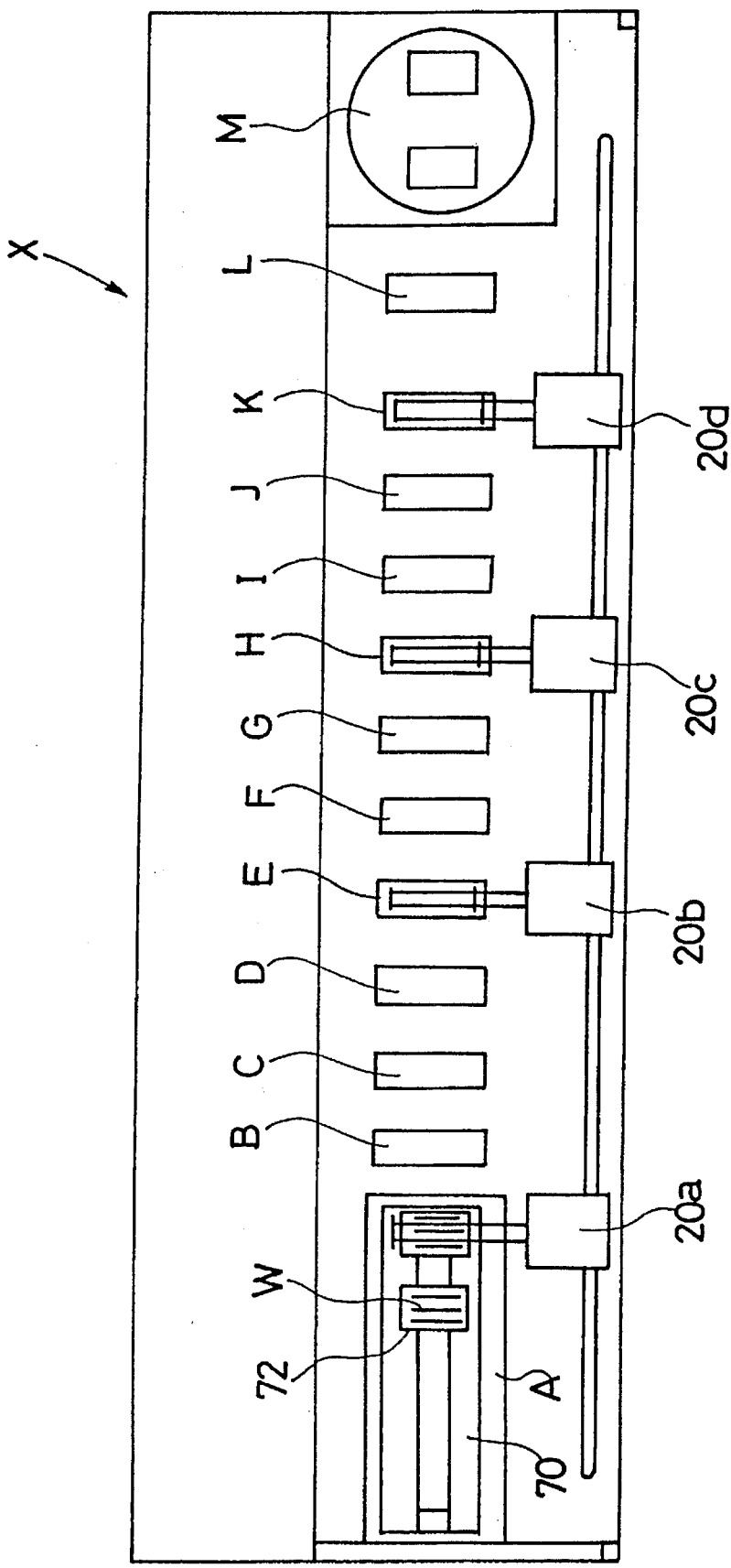
FIG. 7 is a plan view of FIG. 6.
Figure 8:
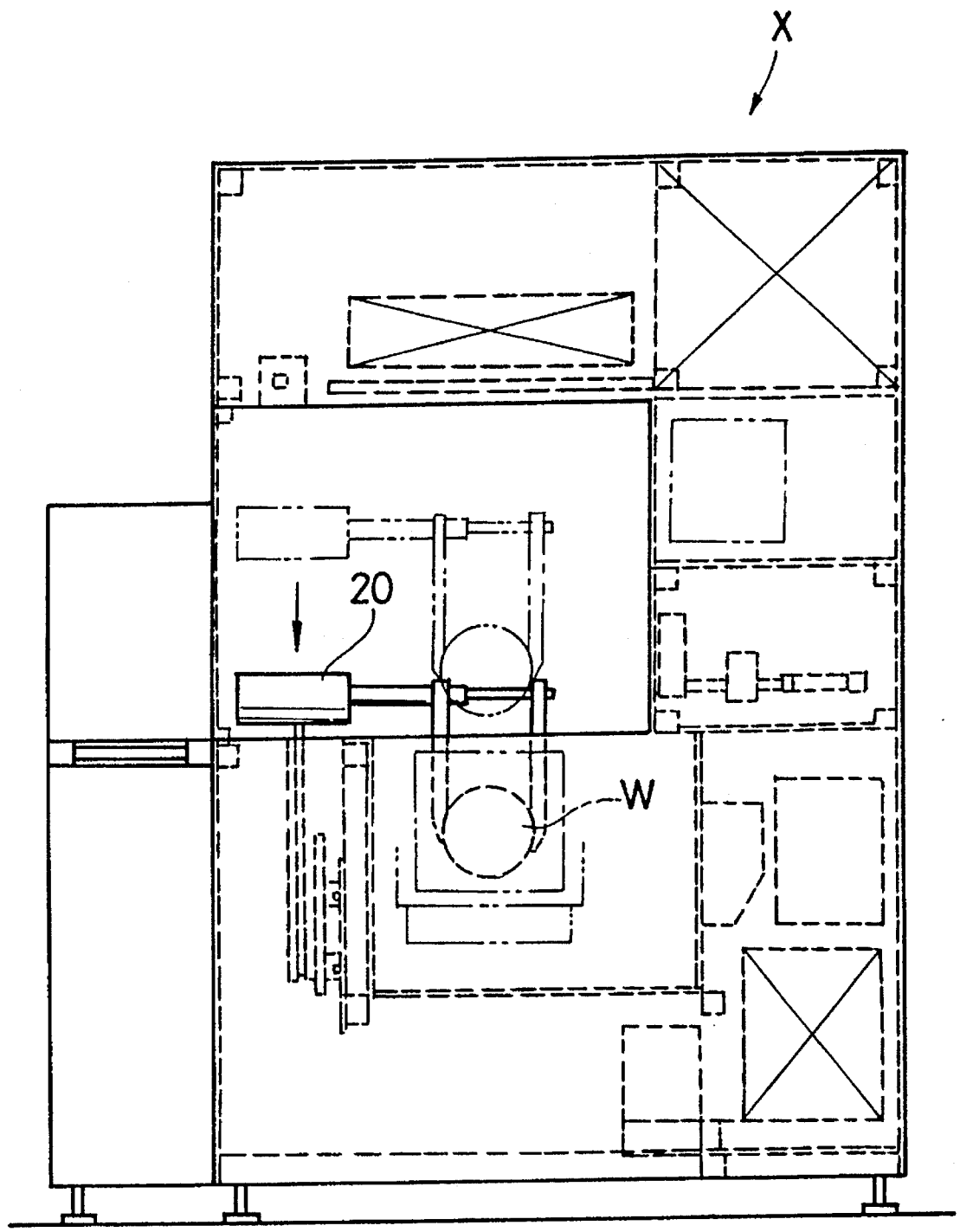
FIG. 8 is a side view of FIG. 6.

A brief description will be given below of the construction and operation of an automatic wafer cleaning equipment in which the wafer cleaning tank 30 of the present invention is incorporated. As shown in FIGS. 6 through 8, the automatic wafer cleaning equipment X includes a loading means or loader A, a series of cleaning tanks B–K, a drying tank L and an unloading means or unloader M.

Wafers W which have been mirror-polished in the preceding process, i.e., polishing process, are loaded in the automatic wafer cleaning equipment X by a belt conveyor 70 while plural wafers W constituting one batch are received in a cassette 72. When the cassette 72 reaches the front end of the belt conveyor 70, the wafers W are thrust upwardly by an appropriate means (not shown) and are gripped in a vertical condition by a handling member of a wafer handling apparatus 20a.

A batch of wafers W thus gripped vertically are automatically immersed successively into the cleaning solutions in the three consecutive cleaning tanks B–D by the wafer handling apparatus 20a. Subsequently, the wafers W are automatically immersed successively in the cleaning solutions in the next three consecutive cleaning tanks E–G under the handling of a wafer handling apparatus 20b. Similarly, they are thereafter automatically placed successively into the cleaning tanks H–K and the drying tank L under the handling of wafer handling apparatuses 20c and 20d. Thus, the wafers W as they are immersed in the respective cleaning tanks B–K are subjected to a series of cleaning processes. The cleaned and dried wafers W are then transferred by the wafer handling apparatus 20d from the drying tank L onto the unloader M which in turn unloads the cleaned wafers W from the automatic wafer cleaning equipment X. Since at least a part of the cleaning tanks B–K, and preferably all of the cleaning tanks B–K are composed of the wafer cleaning tank 30 of this invention described above. The automatic wafer cleaning equipment X is able to conduct a batch cleaning of the wafers W with extremely high efficiency. In FIG. 6, designated by 74 is a window.

It is apparent from the foregoing description that according to the present invention, a plurality of wafers are immersed at one time in the cleaning solution in a wafer cleaning tank while they are stably supported in a substantially vertical position by a three-point supporting structure. The wafer cleaning tank of this invention makes it possible to realize a cassette-less automatic wafer cleaning equipment which is capable of cleaning a plurality of wafers at one time and is readily adaptable to the cleaning of wafers having different diameters.

Obviously, various minor changes and modifications of the present invention are possible in the light of the above teaching. It is therefore to be understood that within the scope of the appended claims the invention may be practiced otherwise than as specifically described.

What is claimed is:

1. A wafer cleaning tank comprising:
   (a) a cleaning tank body containing therein a cleaning solution; and
   (b) wafer supporting means for substantially vertically supporting at least one wafer in said cleaning tank body, said wafer supporting means including
      (i) a pair of confronting fixed wafer support members disposed in said cleaning tank body with a predetermined space therebetween and each having at least one side wafer-supporting portion for supporting an outer edge of the wafer, and
      (ii) a movable wafer support member vertically movably disposed centrally between said pair of fixed wafer support members at a level below said fixed wafer support members and having at least one central wafer-supporting portion corresponding in position to the position of said side wafer-supporting portion of each of said fixed wafer support members for supporting the outer edge of the wafer, said side wafer-supporting portions and said central wafer-supporting portion jointly forming a three-point support structure which supports the wafer at three points on the outer edge thereof,
   wherein said fixed wafer support members and said movable wafer support member are parallel spaced from one another and each composed of an elongated round bar having a plurality of circumferential grooves formed at regular intervals along the length of said round bar, said circumferential grooves each forming said side wafer-supporting portion or said central wafer-supporting portion and being receptive of a portion of the outer edge of the wafer.

2. A wafer cleaning tank comprising:
   (a) a cleaning tank body containing therein a cleaning solution; and
   (b) wafer supporting means for substantially vertically supporting at least one wafer in said cleaning tank body, said wafer supporting means including
      (i) a pair of confronting fixed wafer support members disposed in said cleaning tank body with a predetermined space therebetween and each having at least one side wafer-supporting portion for supporting an outer edge of the wafer, and
      (ii) a movable wafer support member vertically movably disposed centrally between said pair of fixed wafer support members at a level below said fixed wafer support members and having at least one central wafer-supporting portion corresponding in position to the position of said side wafer-supporting portion of each of said fixed wafer support members for supporting the outer edge of the wafer, said side wafer-supporting portions and said central wafer-supporting portion jointly forming a three-point support structure which supports the wafer at three points on the outer edge thereof, wherein said movable wafer supporting member has opposite ends each pivoted to one end of a pair of adjustment rods, the other end of each of said adjustment rods having a suspending portion hung on each of two confronting side plates of said wafer cleaning tank, said other end of said adjustment rods being movable toward and away from each other to move said movable wafer support member in a vertical direction.

3. A wafer cleaning tank according to claim 1, wherein said movable wafer supporting member has opposite ends each pivoted to one end of a pair of adjustment rods, the other end of each of said adjustment rods having a suspending portion hung on each of two confronting side plates of said wafer cleaning tank, said other end of said adjustment rods being movable toward and away from each other to move said movable wafer support member in a vertical direction.

\* \* \* \* \*